(12) United States Patent
Freidhoff et al.

(10) Patent No.: US 6,853,411 B2
(45) Date of Patent: Feb. 8, 2005

(54) LIGHT-PRODUCING HIGH APERTURE RATIO DISPLAY HAVING ALIGNED TILES

(75) Inventors: Henry R. Freidhoff, Rochester, NY (US); Giana M. Phelan, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 141 days.

(21) Appl. No.: 09/788,923

(22) Filed: Feb. 20, 2001

(65) Prior Publication Data

US 2002/0154259 A1 Oct. 24, 2002

(51) Int. Cl.[7] .............................................. G02F 1/1347
(52) U.S. Cl. .............................. 349/75; 349/73; 349/74; 349/77; 349/78; 349/187; 349/103
(58) Field of Search ........................... 349/75, 73, 187, 349/78, 103, 77, 74; 345/103

(56) References Cited

U.S. PATENT DOCUMENTS

| | | | |
|---|---|---|---|
| 5,056,893 A | | 10/1991 | Holz et al. |
| 5,661,531 A | * | 8/1997 | Greene et al. ................. 349/73 |
| 5,903,328 A | | 5/1999 | Greene et al. |
| 5,955,744 A | | 9/1999 | Gu et al. |
| 6,091,194 A | | 7/2000 | Swirbel et al. |
| 6,133,969 A | * | 10/2000 | Babuka et al. ................. 349/73 |

\* cited by examiner

*Primary Examiner*—Tarifur R. Chowdhury
*Assistant Examiner*—George Y. Wang
(74) *Attorney, Agent, or Firm*—Raymond L. Owens

(57) ABSTRACT

A high aperture ratio emissive tiled display comprised of a plurality of tiles including a substrate with discrete layers of integrated drive circuits, thin film transistors, circuit conductor layer and light-emitting pixel array wherein all the electronic circuitry is contained under the pixel array. Vertical interconnects are made between the drive circuits, circuits and pixel electrodes, as necessary, and can include vertical interconnections through the substrate. Large flat panel displays including at least two of said tiles are aligned to maintain pixel pitch from one tile to another to produce a seamless image.

23 Claims, 12 Drawing Sheets

LIGHT-PRODUCING HIGH APERTURE RATIO DISPLAY HAVING ALIGNED TILES

FIELD OF THE INVENTION

The present invention relates to high aperture ratio displays, which include a plurality of tiles aligned to produce an image.

BACKGROUND OF THE INVENTION

Flat panel displays are found everywhere from hand held electronics to large scale video applications. Larger displays are usually smaller displays tiled together. When the displays are tiled it is important to create a bright image that appears seamless across the tiles. The image brightness is proportional to the size of the aperture ratio in the display as defined by the ratio of the emissive surface area of a pixel to the total surface area of the same pixel. Increasing the aperture ratio of the pixel produces a brighter image. However, increasing the space between pixels allows for a proportional increase in the spacing between adjacent tiles, thereby facilitating the ability to create a seamless tiled display. Therefore, any increase in the area available for each pixel can be distributed optimally to increase the aperture ratio, and to increase the space available between pixels including the space between adjacent pixels on abutting tiles.

Flat panel technology has been dominated by liquid crystal displays (LCD's) in which the liquid crystal material, when activated by an electric field, acts as a valve to transmit light from a back light source. LCD's require a transparent path that includes a transparent substrate and transparent pixel electrodes. There cannot be anything blocking the pixel from the backlight. In video LCD displays the space available for creating seams between tiles is limited by the rows of circuits that fill the space between pixels.

U.S. Pat. No. 5,056,893 describes a technique in which there is increased space for a seam by making the pixels at the edge of a tile smaller. Reducing the size of the pixels is a significant trade-off in brightness and image quality. U.S. Pat. No. 5,903,328 describes tiled LCD displays where the adjacent tile edges are ground at an angle and overlap each other. This allows a small increase in the space for the ground edge relative to the adjacent pixels; however, as the space increases the distance between the image planes of adjacent tiles increases proportionally. U.S. Pat. No. 6,136,621 describes a method for making a high aspect ratio gated emitter wherein the lower gate is partially covered by an insulator and the upper gate; the lower gate extends through a hole in the insulator and the upper gate. U.S. Pat. No. 5,955,744 describes a LCD display wherein the TFT is under the pixel electrode, located just outside the perimeter of the pixel so as not to block light from the backlight.

Emissive displays, which produce their own light, do not require a transparent substrate. The pixels do not have to be positioned over a transparent substrate or a transparent electrode. This allows for stacking of the integrated drive circuits and the circuits under the light-emitting layer which contains only an array of light-emitting pixels. These tiles can be arrayed together to make a monolithic tiled display wherein the pixel pitch across the seam of adjacent tiles is substantially equal to that of the pixel pitch within a tile. In order to achieve an emissive device with high aspect ratio pixels, the pixels on each tile are addressed through vertical connections and a conductor layer to the corresponding circuits. The drive circuits are semiconductor electronics that are manufactured directly on the substrate and can be on the same level as the circuits or under the circuits. The drive circuits can also be located on the bottom side of the substrate and connected using vertically connections through the substrate. U.S. Pat. No. 6,091,194 describes an emissive display tile in which discrete drive circuits are attached to the bottom side of the tile.

SUMMARY OF THE INVENTION

It is an object of the present invention to provide a high aperture ratio emissive display for use in multiple tile applications. It is another object of the present invention to provide a high aperture ratio emissive tiled display which is particularly suitable for producing video images.

This object is achieved by a high aperture ratio display comprising:

a) at least two tiles having rows and columns of electric field actuable pixels which produce light from one surface of each tile, the pitch between each column of each tile being substantially the same and the pitch between each row of each tile being substantially the same, the tiles being arranged so that, when aligned, the pitch between adjacent pixels in adjacent tiles is the same so that when light is emitted from the surface of the tiles, it does not have intertile artifacts;

b) a plurality of conductors disposed under the pixels of each tile and arranged to provide an electrical connection between the pixels of each tile; and c) circuits electrically connected to the conductors for producing electrical signals which cause the emission of light in the pixels of each tile to produce an image.

ADVANTAGES

It is an advantage of the present invention that the pixel aperture ratio can be larger than that of prior art in a tiled display. This high aperture ratio on the light-emitting surface can be achieved by eliminating the need to share space with the electronics. Thus, the pixels can extend to all edges of each display tile wherein the circuits and conductors are on layers under the pixels and are contained in an area defined by the outermost pixels on each tile.

It is a further advantage of the present invention that the increased space allowed for each pixel can provide additional space between pixels. The total area available for each pixel can be optimized to establish a large pixel in conjunction with adequate space between pixels. The space between pixels determines the space available for the seam between two or more tiles that are positioned adjacently to create a tiled display.

It is a further advantage of the present invention that a high aperture ratio tiled display can be an array of tiles that include island tiles, tiles that do not have an edge along the perimeter of the display. This is accomplished by extending the pixels to all edges of a tile and by utilizing vertical connections to address each pixel.

It is a further advantage of the present invention that the integration of the semiconductor drive circuits on the tile significantly reduces the number of external interconnections necessary to address the display.

It is a further advantage of the present invention that it is suitable for use in organic electroluminescent displays.

DETAILED DESCRIPTION OF THE PREFERRED EMBODIMENTS

Figure 1:
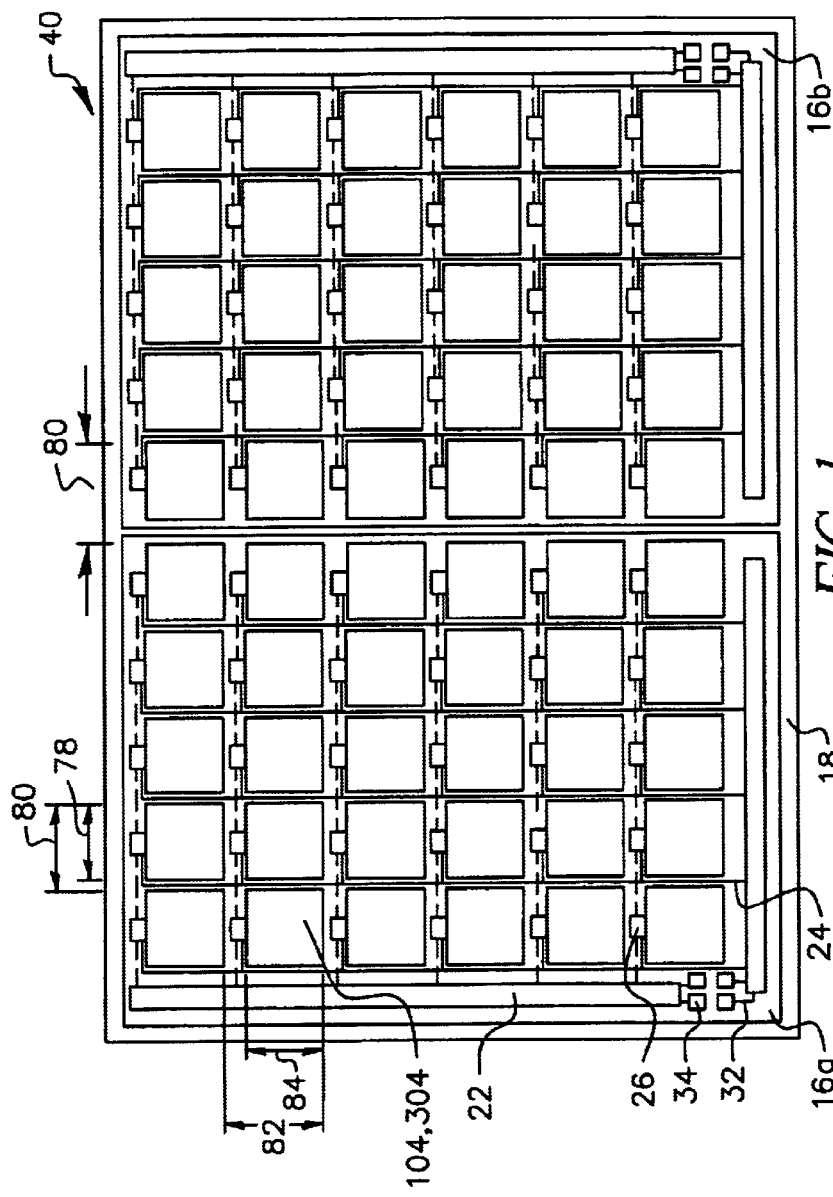
FIG. 1 is a top view of a prior art tiled display with two tiles.
Figure 2:
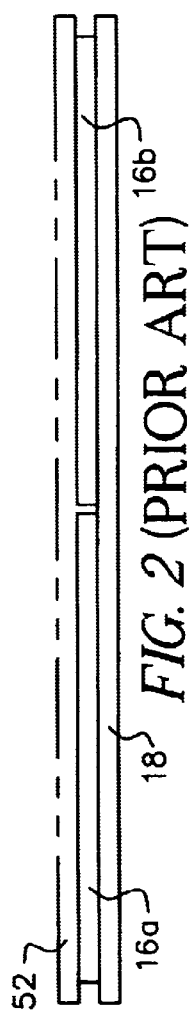
FIG. 2 is front view of the tiled display in FIG. 1.

Turning now to FIGS. 1 and 2 which show a prior art for a tiled display 40 having a plurality of tiles 16a–16b each with circuits 26 and drive circuits 22 and pixel electrodes 104 or 304, formed on a back plate 18. It is understood that the drive circuits 22, circuits 26 and pixel electrodes 104 or 304 for each tile 16a–16b exist in the same circuit layer. It is further understood that the circuit 26 includes the thin film transistors and associated capacitors. The pixel aperture ratio is limited by the space required for the circuits 26 and, furthermore, the drive circuits 22 extend beyond the area defined by the outermost pixels on each tile. Alternately, the drive circuits 22 are separate discrete components that are interconnected to the tile using tape automated bonding or other means. The horizontal pitch 80 between adjacent pixels on adjacent tiles, across a seam, is substantially equivalent to the horizontal pixel pitch 80 on a single tile. Additionally, the vertical pixel pitch 82 and the horizontal pixel pitch 80 are substantially the same for all tiles in the display. The vertical pixel length 84 and horizontal pixel length 78 are used in conjunction with the vertical pixel pitch 82 and the horizontal pixel pitch 80 to calculate the aperture ratio using the following equation: (84 ×78)/(82 ×80)=aperture ratio.

Figure 3:
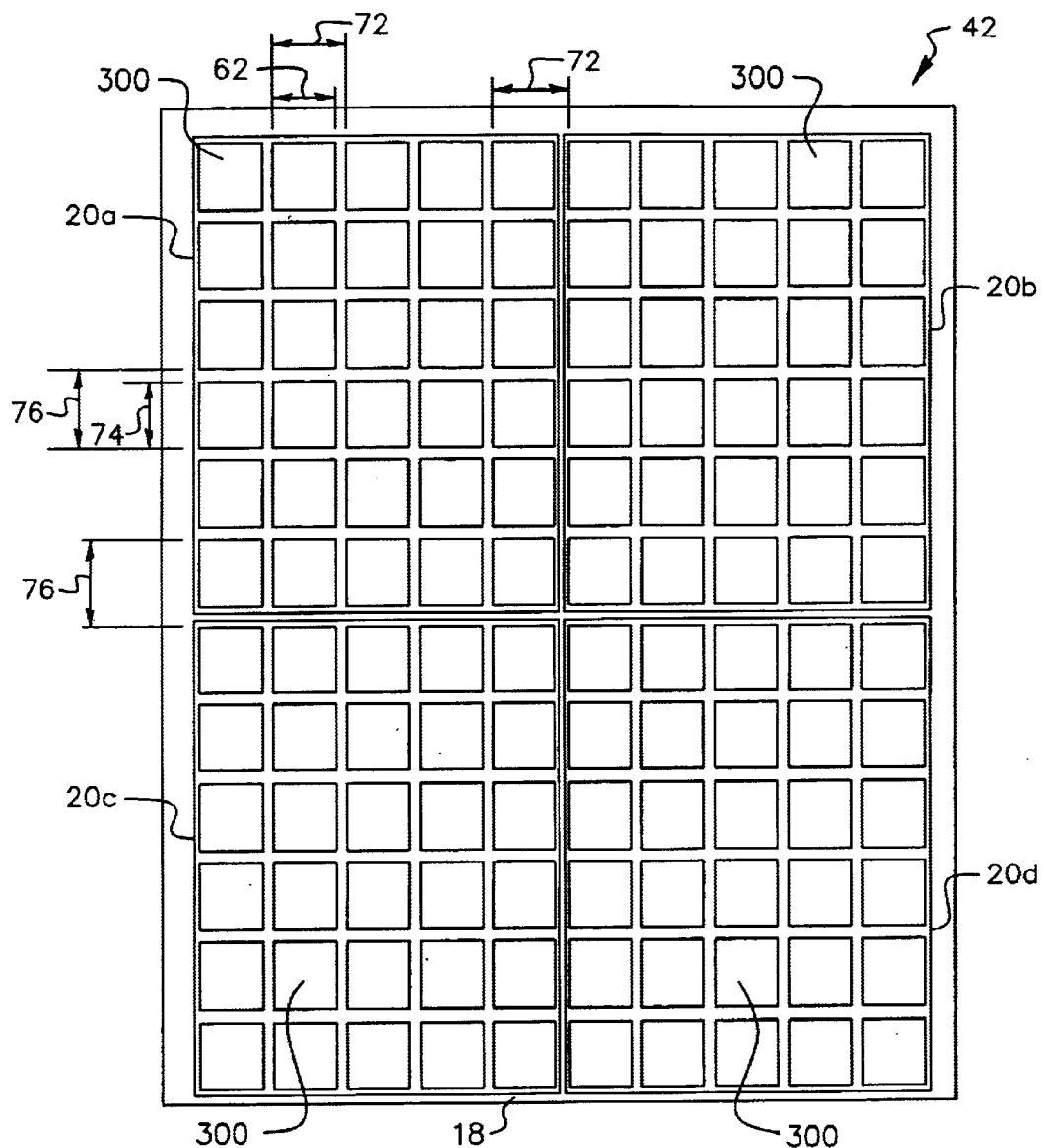
FIG. 3 is a top view of an emissive tiled display comprised of four multilayer emissive tiles on a back plate.
Figure 4:
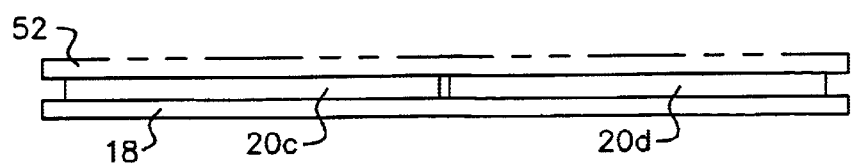
FIG. 4 is front view of the emissive tiled display in FIG. 3.
Figure 5:
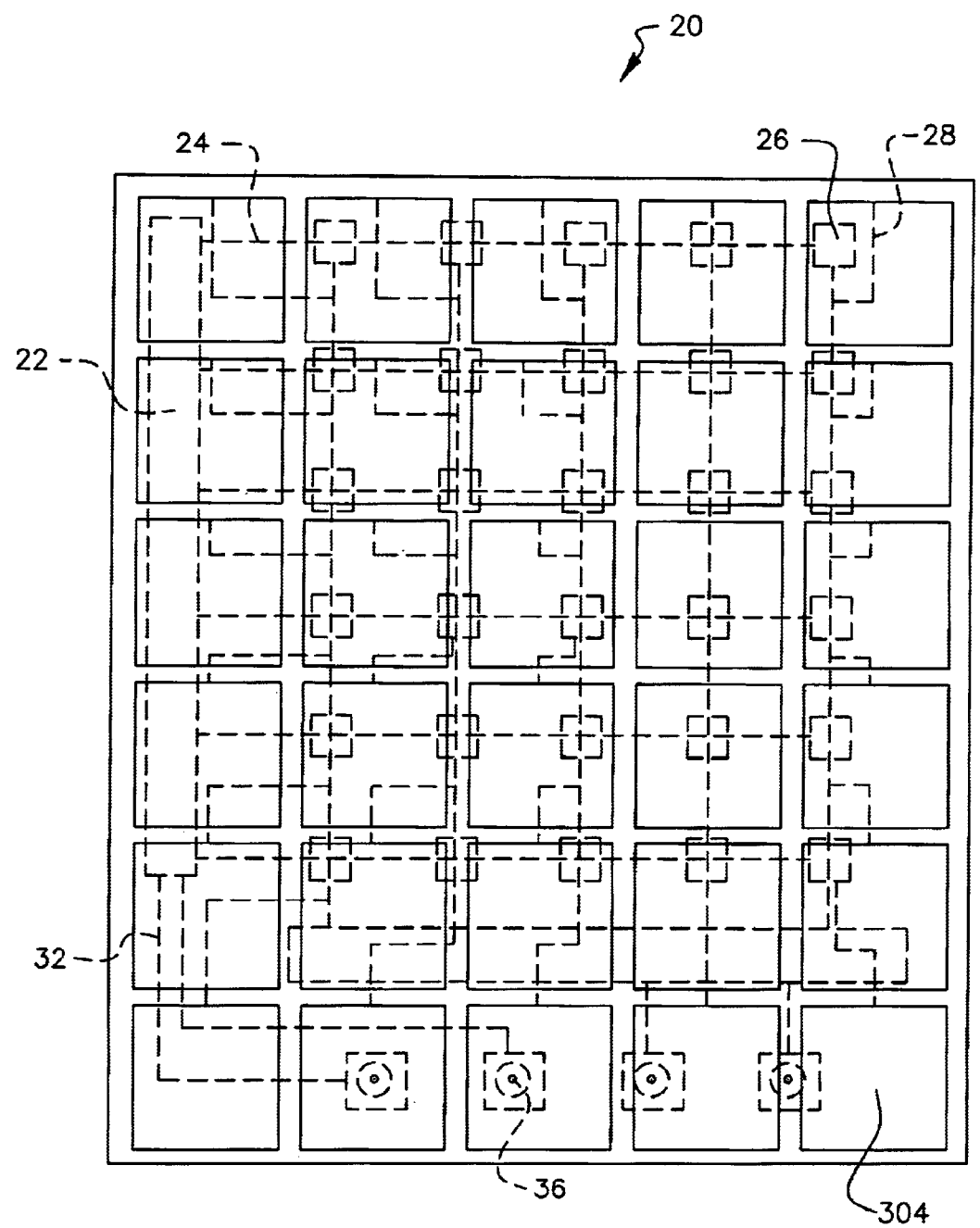
FIG. 5 is a composite top view of a multilayer emissive tile from the tiled display in FIG. 3 having the circuits and drive circuits with the pixel cathode and light-emitting layers removed.

Referring to FIGS. 3–5, an emissive tiled display 42 is comprised of two or more emissive tiles 20a–d arrayed, or tiled, together to provide a monolithic seamless display. The stacking of the circuits 26 and drive circuits 22 (see FIG. 5) under the pixels on each tile allows for pixels 300 to be positioned near the edge of tiles 20a–20d with the distance from the outermost pixel edge to the tile edge at most equal to one-half the space between pixels 300. Furthermore, the integration of the drive circuits 22 onto each tile reduces the number of external signal connections (not illustrated in this embodiment) needed. The stacking of the drive circuits 22 under the pixels allows for the external signal connections to be made in the limited space at the edge of the tile 20, or alternately, through vertical connections 36 to the back of the tile 20. Furthermore, a conductor can be provided along a tile edge to an adjacent tile for the purpose of carrying electrical signals out to the edge of a perimeter tile. The vertical 76 and horizontal pitch 72 between adjacent pixels on adjacent tiles, across a seam, is substantially equivalent to the vertical 76 and horizontal 72 pixel pitch on a single tile. Additionally, the vertical 76 and horizontal 72 pixel pitch is substantially the same for all tiles in the display. The vertical pixel length 74 and horizontal pixel length 62 are used in conjunction with the vertical pixel pitch 76 and the horizontal pixel pitch 72 to calculate the aperture ratio using the following equation: (74 ×62)/(76 ×72)=aperture ratio.

Figure 6:
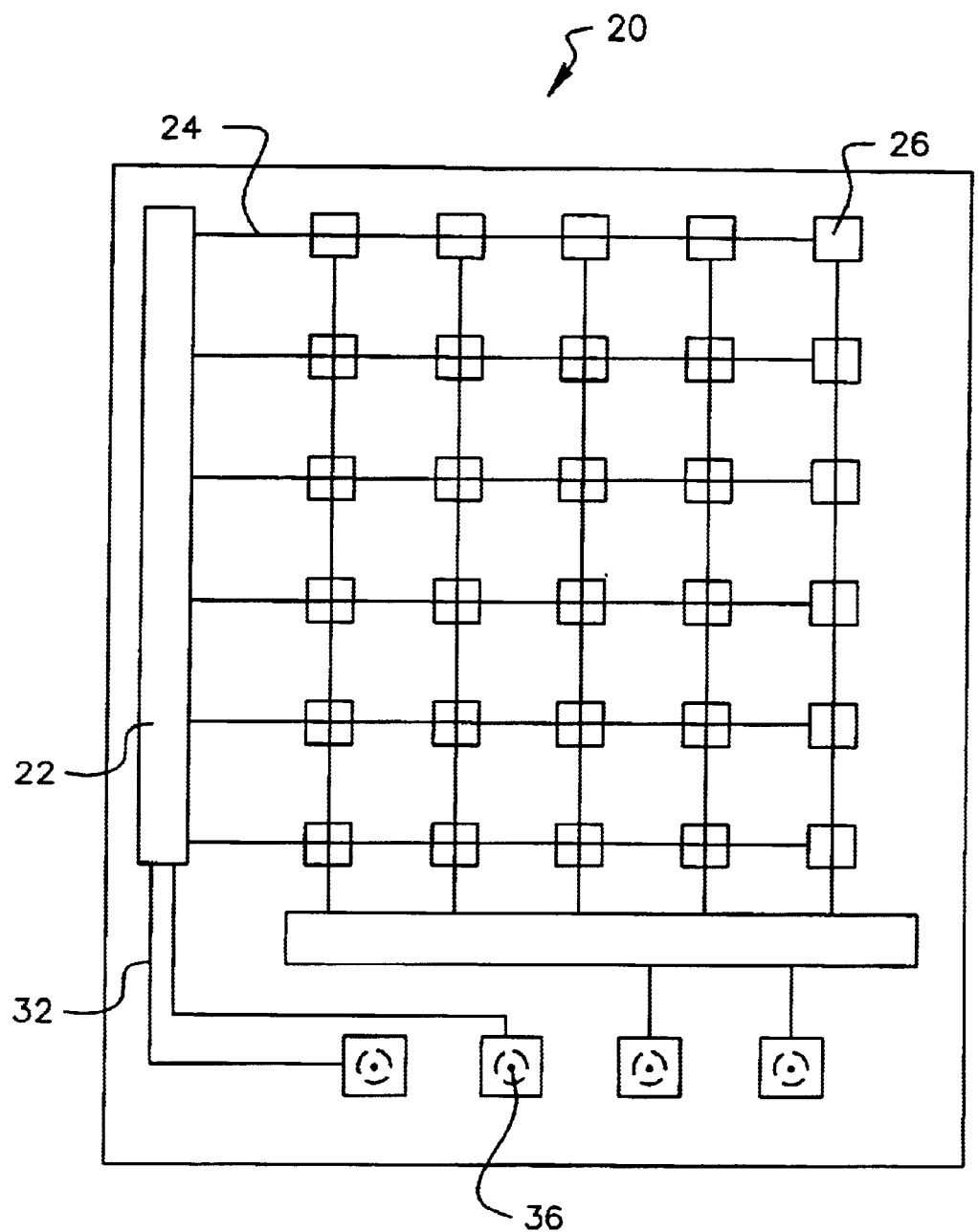
FIG. 6 is a top view of an alternative multilayer emissive tile from the tiled display in FIG. 3 showing the layer for the circuits and the drive circuits.
Figure 7:
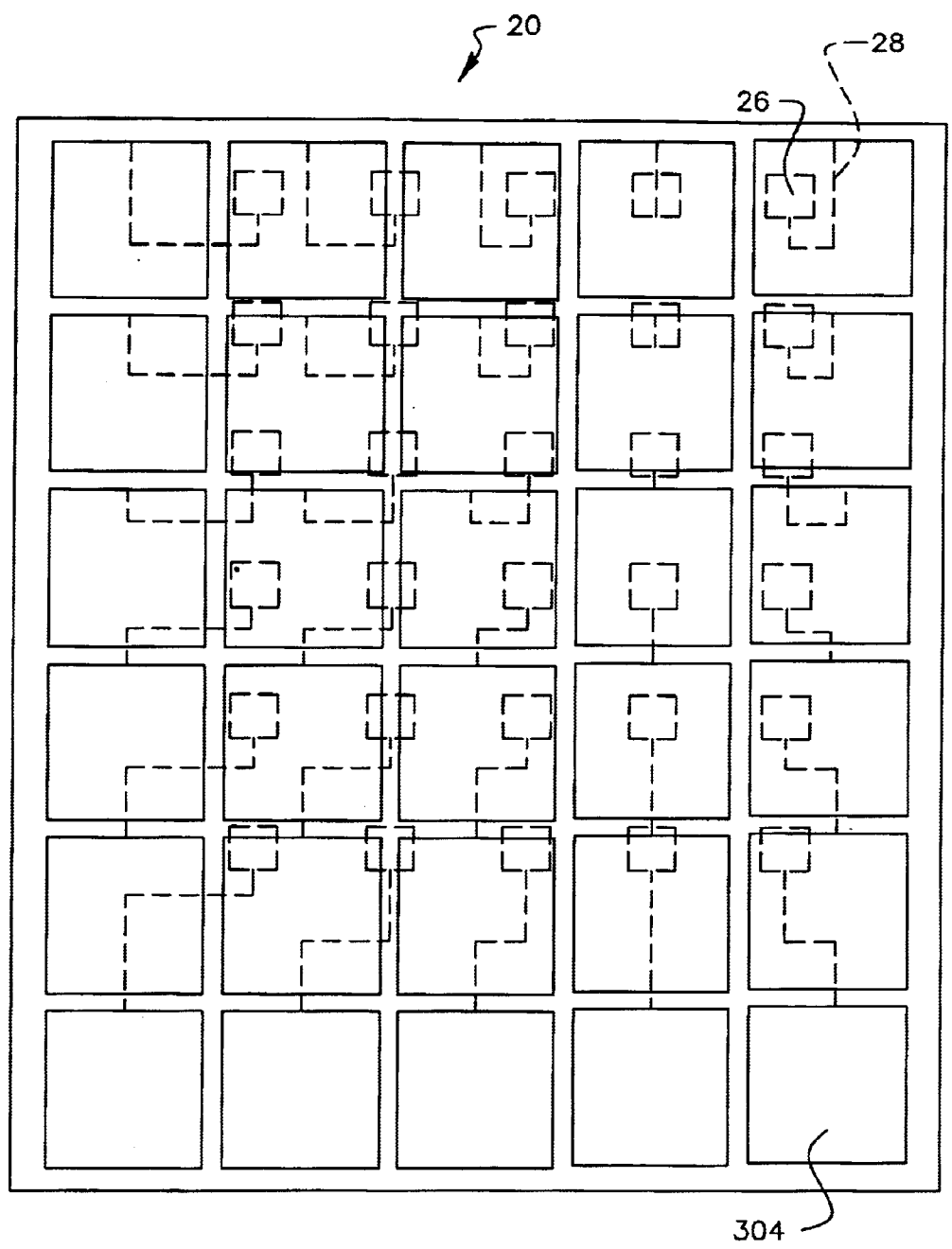
FIG. 7 is a top view of a multilayer emissive tile from the tiled display in FIG. 3 showing the conductor layer for interconnection of the circuits to the pixel electrodes.

The preferred embodiment of emissive tiles for use in the tiled emissive display is shown in FIGS. 5–7. FIG. 5 shows a composite view of an emissive multilayer tile 20 from the tiled display shown in FIG. 3. FIG.6 shows the drive circuits 22 and the circuits 26 that are located on the same plane on the tile 20 and are electrically connected by connectors 24. The tile 20 does not have to be transparent but may be any material compatible with TFT processing including, but not limited to, glass and co-fired ceramic. The pixel electrodes 304 are located above the circuits 26 and separated by insulating layers 60 and 66 shown in cross-sections FIGS. 11–13. FIG. 7 shows the circuits 26 connected to the pixel electrodes 304 by means of an additional layer containing a plurality of conductors 28 shown between the insulating layers 60 and 66 in FIGS. 11–14. Also shown in these figures are the components of the TFT circuits: source 30, insulating layer 58, gate insulator 64, anisotropic silicon 68, and drain 70. It is the preferred embodiment that the drive circuits 22 and circuits 26 are contained in an area defined by the outermost pixels wherein drive circuits 22 and circuits 26 do not extend past the outermost pixels. It is understood that each circuit 26 is not necessarily located directly under the corresponding pixel electrode 304. The circuits 26 are electrically connected to the pixel electrode 304 through vertical connections and interconnections 28. Although the drive circuits 22 and circuits 26 are under the pixel array, the connections to the drive circuits, as shown in FIG. 5, can be made through vertical connections 36 that extend to the backside of the tile 20. Alternately, the external interconnections to the drive circuits 22 can extend to one or more edges of the tile 20, beyond the outermost pixel.

Figure 8:
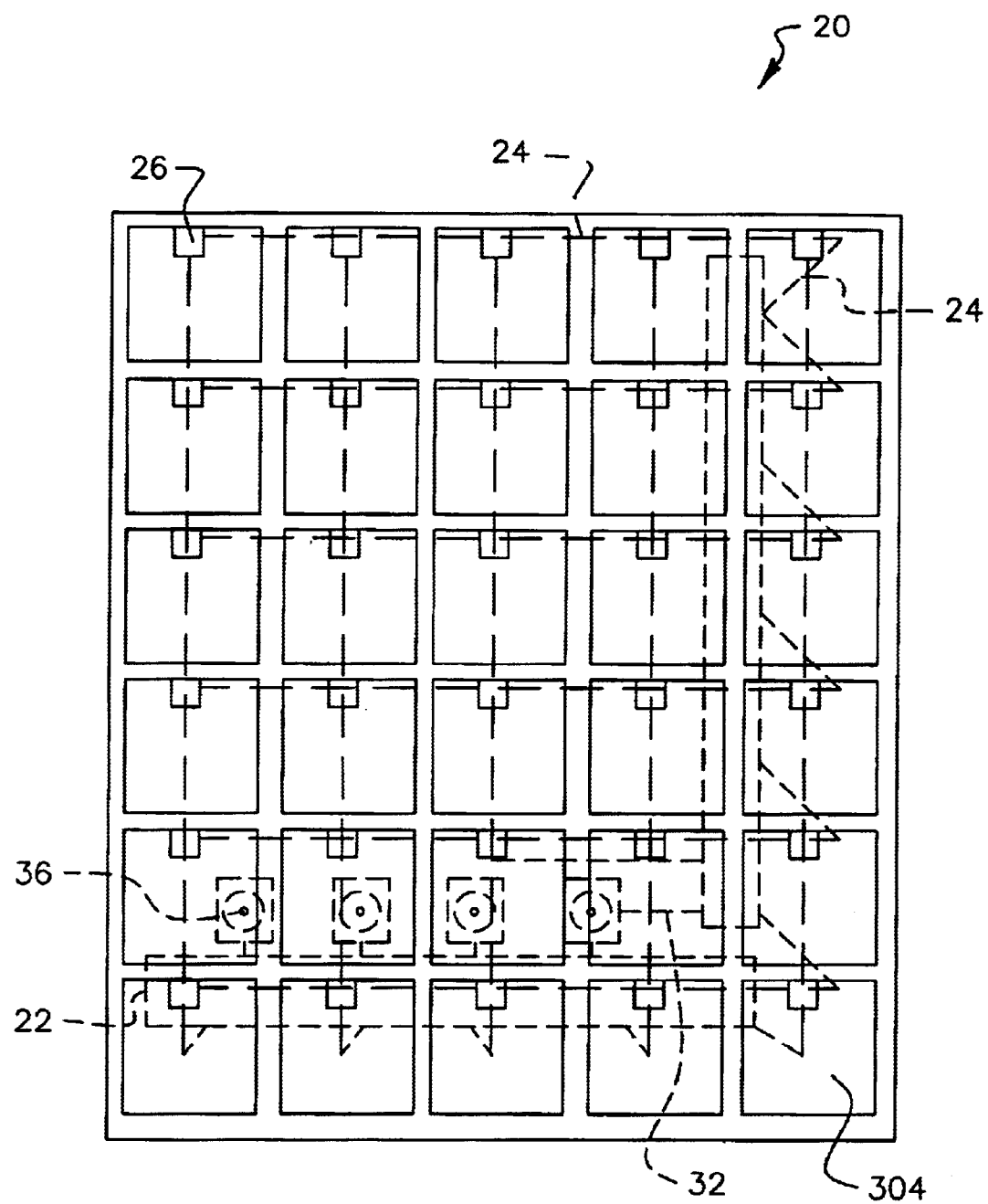
FIG. 8 is a top view of an alternative multilayer emissive tile from the tiled display in FIG. 3 showing a tile where pixel electrodes, interconnects, circuits and drive circuits are on separate layers.

In another embodiment, the drive circuits 22 are integrated on a separate layer under the circuits. As shown in FIG. 8, circuits 26 reside above the drive circuits 22 and are separated from the drive circuits by an insulating layer. The pixel electrodes 304 are located above the circuits 26, separated by another insulating layer. The interconnections 24 from the drive circuits 22 to the circuits 26 and from the circuits 26 to the pixel electrodes 304 are made using vertical connections 36. Furthermore, a layer containing a plurality of conductors 28 can be used to connect the circuits 26 to the pixel electrodes 304. External signal connections to the drive circuits can be made along one or more edges of the tile 20, or through vertical connections 36 to the backside of the tile 20 and on to the drive circuits through drive circuit signal connections 32.

Figure 9:
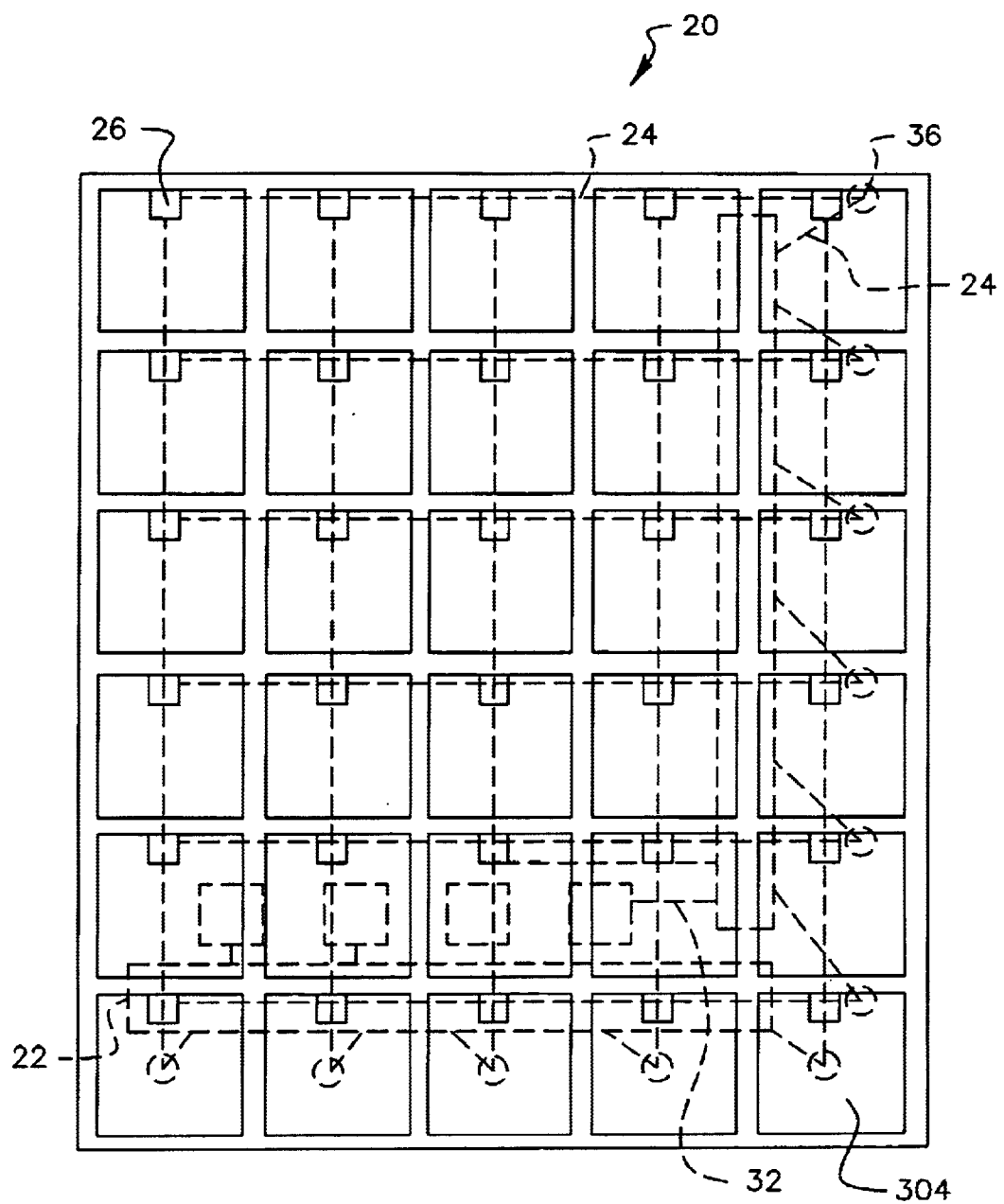
FIG. 9 is a top view of an alternative multilayer emissive tile from the tiled display in FIG. 3 with the integrated drive circuits on the back side of the tile and with vertical connections through the tile to the drive circuits on the top.
Figure 10:
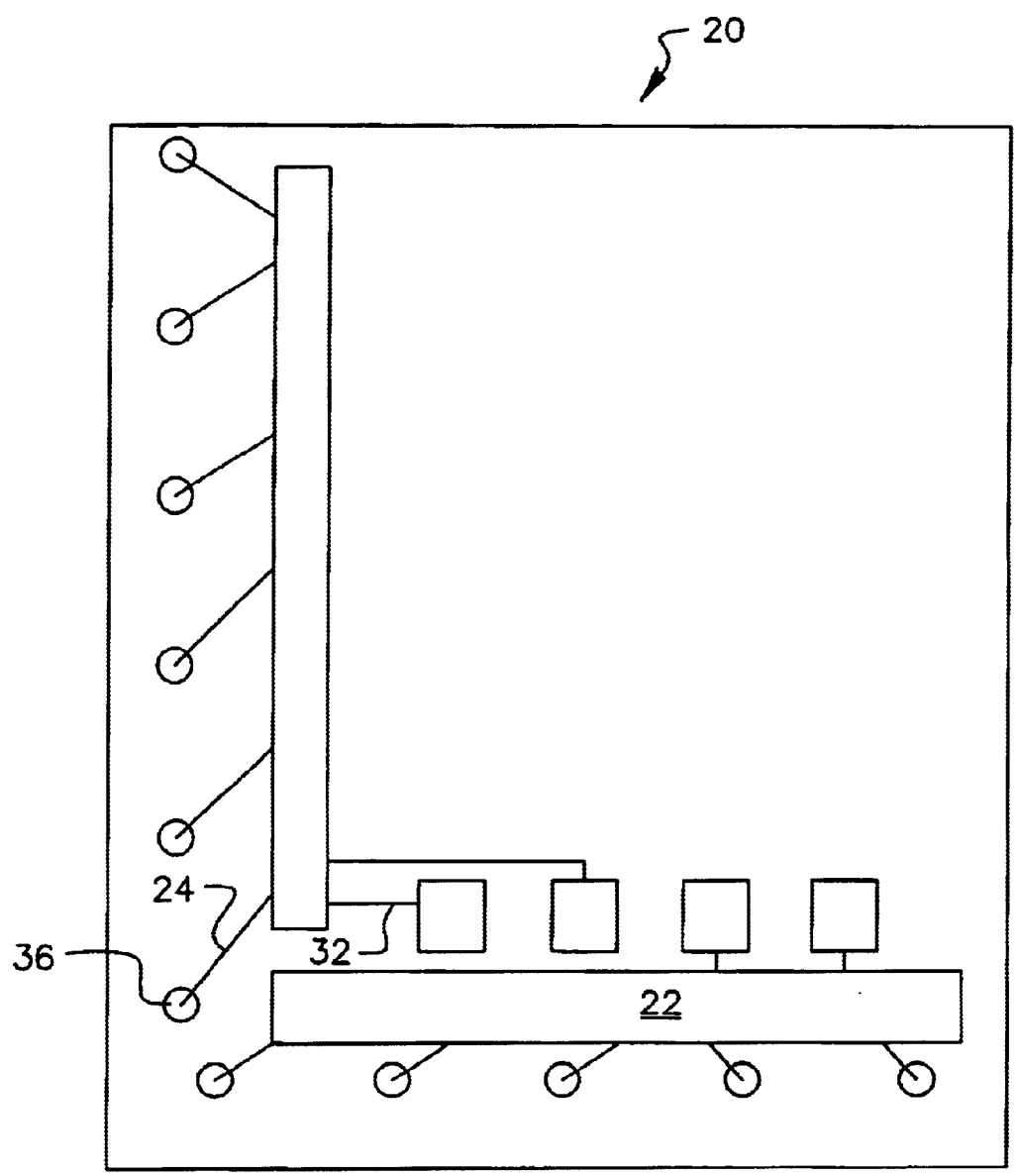
FIG. 10 is a bottom view of the emissive tile shown in FIG. 9.

In another embodiment, as shown in FIGS. 9 and 10, the drive circuits 22 are integrated on the backside of the tile 20. The drive circuits 22 are electrically connected to the topside circuits 26 through the tile 20 using vertical connections 36. It is understood that double side TFT processing is required on the tile. Furthermore, a layer containing a plurality of conductors 28 can be used to connect circuits 26 that are offset from the pixels electrodes 304 to the pixel electrodes 304. External signal connections to the drive circuits 22 can be made to the backside of the tile 20.

Figure 11:
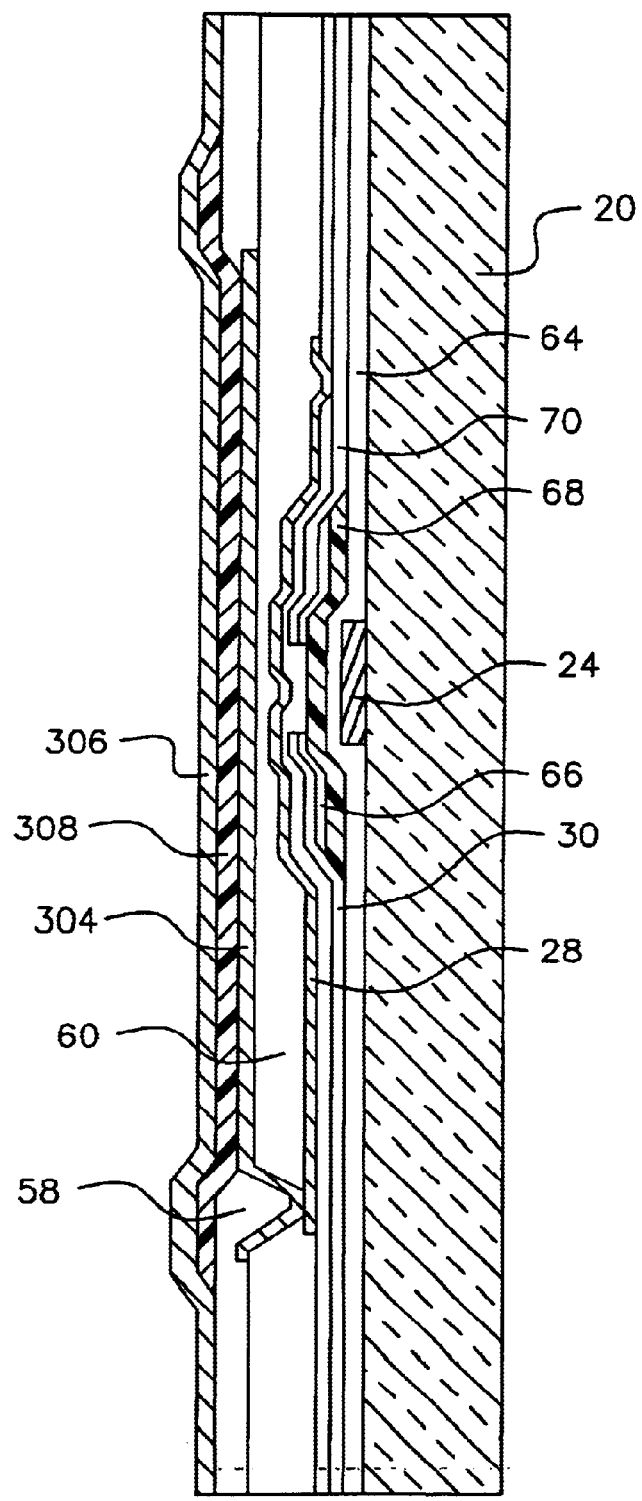
FIG. 11 is a cross section of a multilayer emissive tiled display from the tiled display in FIG. 3 with light-emitting pixels of different colors.
Figure 12:
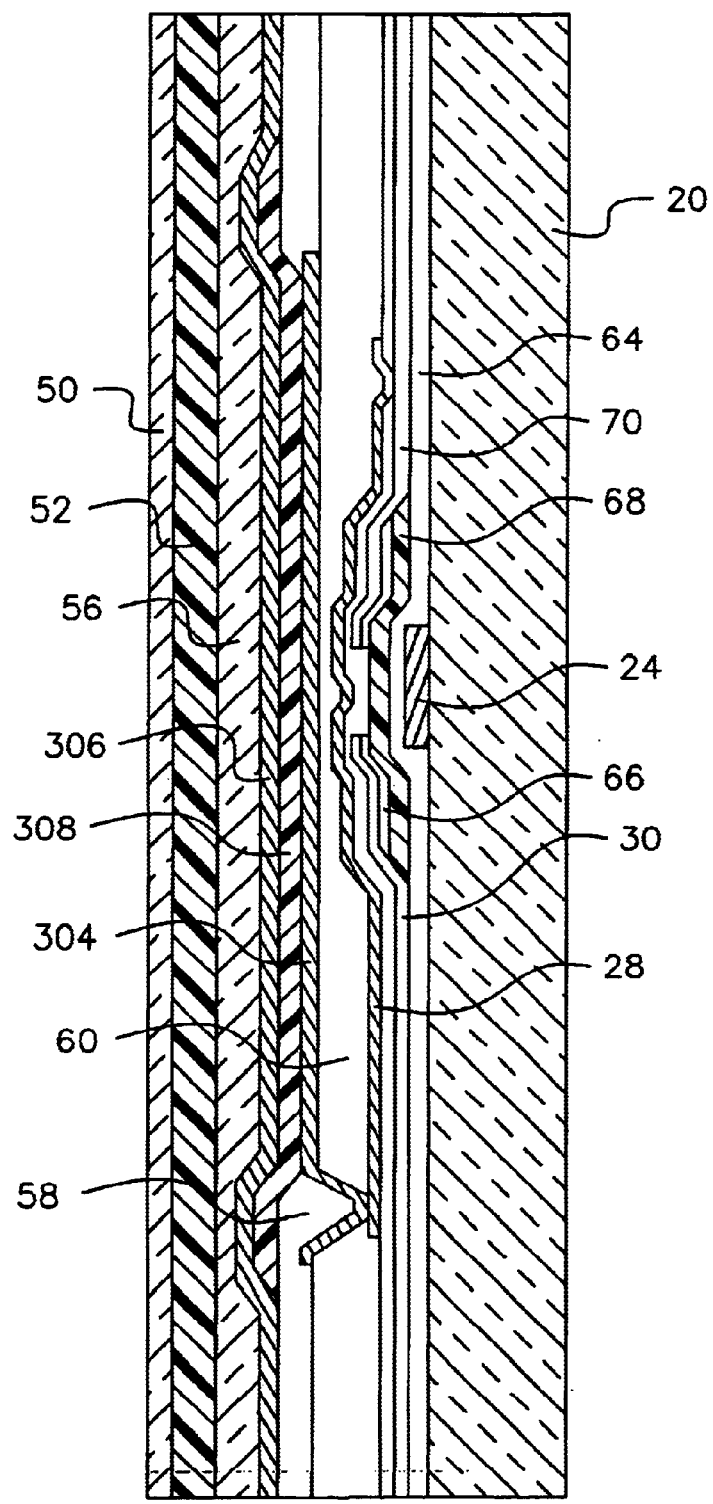
FIG. 12 is a cross section of a multilayer emissive tiled display from the tiled display in FIG. 3 with light-emitting pixels of different colors and a cover plate.
Figure 13:
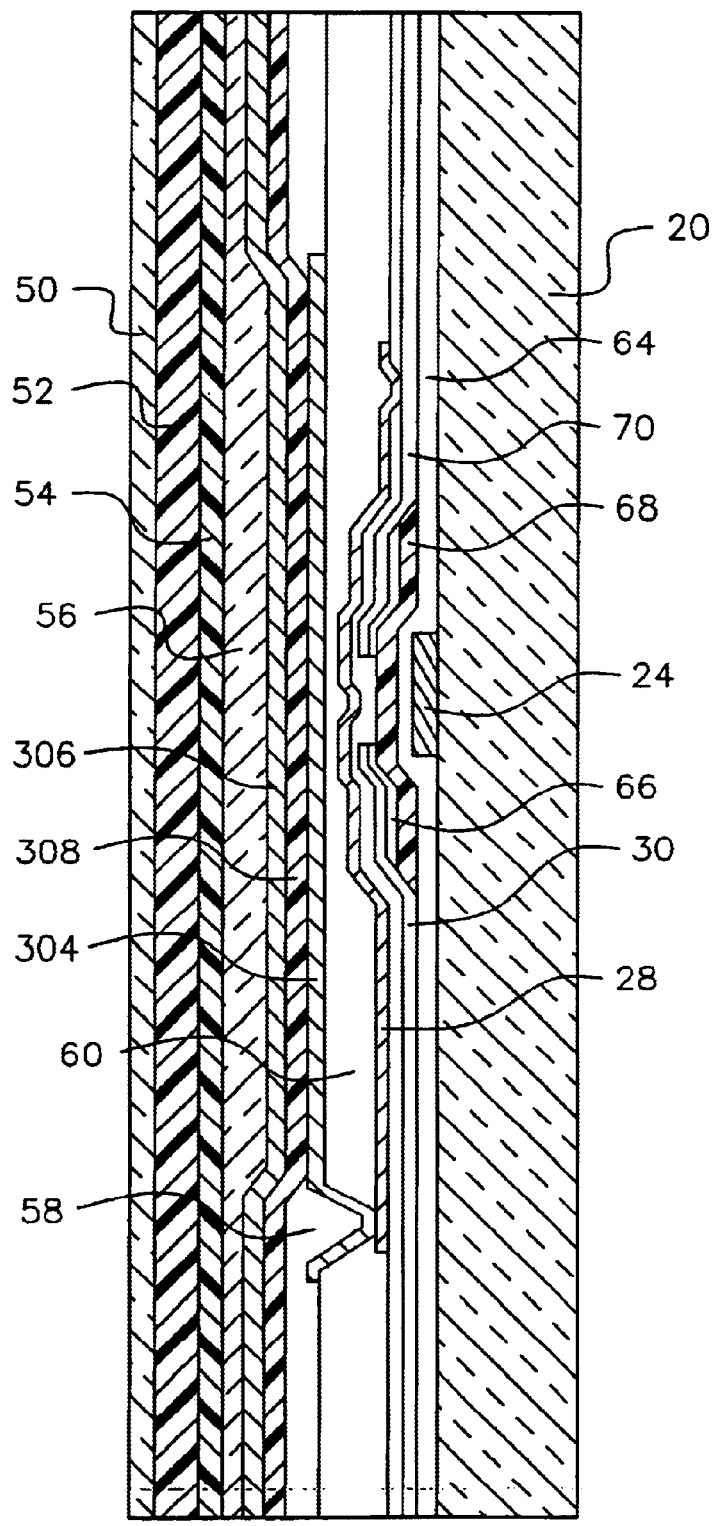
FIG. 13 is a cross section of an alternative multilayer emissive tiled display from the tiled display in FIG. 3 with a continuous emitting layer for white light-emitting pixels and a cover plate with different color filters aligned to the pixels.

FIG. 11 shows the cross-section of the multilayer emissive tile 20. In this embodiment, the drive circuits 22 and circuits 26 are electrically connected to the pixels 300 through the conductor layer 28. As shown in FIG. 12, the display includes a cover plate 52 and the display is viewed through the cover plate 52. The cover plate 52 is a transparent substrate and includes, but is not limited to, glass and plastic. It is understood that a material 56 that has matching index of refraction to the cover plate 52 can be used to fill any gaps between the pixels 300 and the cover plate 52. This material can also provide moisture and oxygen protection. In the preferred embodiment the cover plate 52 includes a polarization layer 50 to increase the contrast ratio of the display. In another embodiment, as shown in FIG. 13, the cover plate 52 includes a color filter array 54. The patterned color filter array 54 is aligned with the pixel array. When a color filter array 54 is employed on the cover plate 52 the pixels 300 are understood to be white light-emitting. Furthermore, the light-emitting layer 308 can be a continuous coating as shown. The cover plate 52 is bonded to the emissive tile 20 by means including, but not limited to, adhesive, metal and solgel. A desiccant can be positioned in or near the seals between the tile 20 and the cover plate 52. Furthermore, an oxygen getter can be positioned in or near the seals between the tile 20 and the cover plate 52.

In a further embodiment, the tiles are positioned between the cover plate 52 and a back plate 18. The tiles can be affixed to either the cover plate 52 or back plate 18. The back plate 18 does not need to be transparent. Additionally, electrical connections can be made from the tile to the back plate 18. In a further embodiment, the cover plate 52 and back plate 18 are sealed around the perimeter enclosing the tile array within. In a further embodiment, a desiccant may also be positioned in or near any of the seals previously described. Alternately, an oxygen getter is positioned in or near any of the seals previously described.

Figure 14:
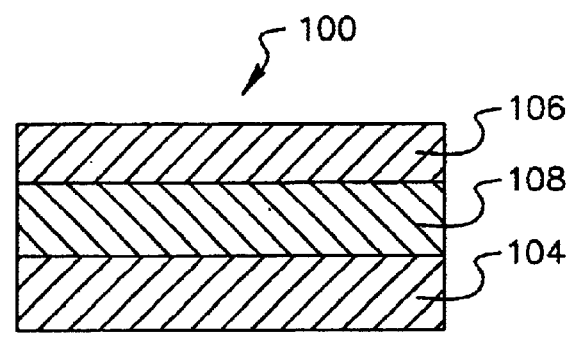
FIG. 14 is a cross section of a simple organic light-emitting device.
Figure 15:
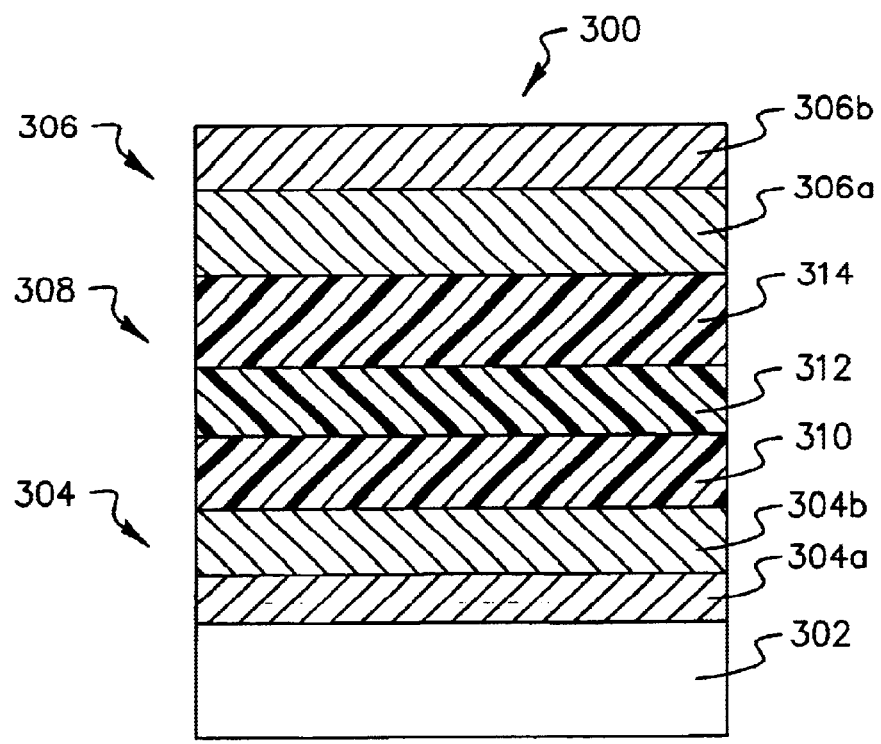
FIG. 15 is a cross section of an organic light-emitting pixel for emitting light through the top of the pixel, away from the tile.

The present invention is applicable to emissive displays, and is particularly suitable for, but not limited to, use in organic electroluminescent displays. FIGS. 14 and 15 describe examples of pixels with organic electroluminescent materials.

A light-emitting layer of an organic electroluminescent tile comprises a luminescent or fluorescent material where electroluminescence is produced as a result of electron-hole pair recombination in this region. In the simplest construction of a light-emitting pixel 100, as shown in FIG. 14, the light-emitting layer 108 is sandwiched between pixel electrode 104 that is an anode and the cathode 106. The light-emitting layer 108 is a pure material with a high luminescent efficiency. A well known material is tris (8-quinolinato) aluminum, (Alq), which produces excellent green electroluminescence.

The simple pixel structure 100 can be modified to a multilayer structure in which an additional electroluminescent layer is introduced between the hole and electron-transporting layers to function primarily as the site for hole-electron recombination and thus electroluminescence. In this respect, the functions of the individual organic layers are distinct and can therefore be optimized independently. Thus, the electroluminescent or recombination layer can be chosen to have a desirable EL color as well as high luminance efficiency. Likewise, the electron and hole transport layers can be optimized primarily for the carrier transport property.

In a preferred embodiment, the pixel 100 is described as a multilayer organic device that emits light from the top. As shown in FIG. 15, the multilayer organic device 300 has a substrate 302 on which is disposed a light reflective conductive anode 304. The anode 304 comprises two layers including a light reflective conductive metal layer 304a and a thin transparent layer of a conductive high work function material 304b. An organic light-emitting structure 308 is formed between the anode 304 and a cathode 306. The cathode 306 is composed of two layers including a thin transparent conductive layer of a low work function material 306a and a transparent conductive layer such as indium tin oxide 306b. The organic light-emitting structure 308 is comprised of, in sequence, an organic hole-transporting layer 310, an organic light-emitting layer 312, and an organic electron-transporting layer 314. When an electrical potential difference (not shown) is applied between the anode 304 and the cathode 306, the cathode will inject electrons into the electron-transporting layer 314, and the electrons will migrate across layer 314 to the light-emitting layer 312. At the same time, holes will be injected from the anode 304 into the hole-transporting layer 310. The holes will migrate across layer 310 and recombine with electrons at or near a junction formed between the hole-transporting layer 310 and the light-emitting layer 312. When a migrating electron drops from its conduction band to a valence band in filling a hole, energy is released as light, and is emitted through the light-transmissive cathode 306.

The invention has been described in detail with particular reference to certain preferred embodiments thereof, but it will be understood that variations and modifications can be effected with the spirit and scope of the invention.

What is claimed is:

1. A high aperture ratio display comprising:
   at least two tiles having rows and columns of electric field actuable pixels formed only on one side thereof, which pixels produce light from one surface of each tile, wherein the pitch between the columns of each tile is substantially the same, the pitch between the rows of each tile is substantially the same, and at least one tile edge of each of the tiles being parallel to the pixel row or column, and the distance from an outermost pixel edge to the tile edge parallel to the pixel edge being at most equal to one-half the pitch between the pixel columns or rows to provide a monolithic seamless display to prevent intertile artifacts between the pixels of the adjacent tiles;
   a plurality of conductors disposed only on the one side of each tile and arranged to provide an electrical connection between the pixels of each tile; and circuits electrically connected to the conductors for producing electrical signals that cause the emission of light in the pixels of each tile disposed only on the one side of the tile, wherein the pixels are formed above the conductors and the circuits, with the conductors and the circuits disposed adjacent to and underneath a non-emissive side of the pixels.

2. The high aperture ratio display of claim 1, wherein the conductors are fabricated on the tiles and the electrically connected circuits further include at least one layer on each tile having thin film transistors connected to the conductors.

3. The high aperture ratio display of claim 2, wherein the electrically connected circuits include drive circuits connected to the thin film transistors for multiplex operation of the transistors to cause electrical signals to be provided to the pixels to produce a video image.

4. A high aperture ratio display comprising:

at least two tiles having rows and columns of electric field actuable pixels formed only one side thereof, which pixels produce light from one surface of each tile, wherein the pitch between the columns of each tile is substantially the same, the pitch between the rows of each tile is substantially the same, at and least one tile edge of each of the tiles being parallel to the pixel row or column, and the distance from an outermost pixel edge to the tile edge parallel to the pixel edge being at most equal to one-half the pitch between the pixel columns or rows to provide a monolithic seamless display to prevent intertile artifacts between the pixels of the adjacent tiles;

a plurality of conductors connected to the pixels of each tile and a layer disposed on a non-emissive side of each die, end formed with a plurality of thin film transistors connected to the conductors, the conductors, the layers, and the thin film transistors being disposed only on the one side of each tile, adjacent to a non-emissive side of the pixels; and drive circuits disposed on the one side of each tile adjacent to the non-emissive side of the pixels, and electrically connected to the thin film transistors for producing electrical signals for multiplex operation of the transistors to cause the electrical signals to be provided to the pixels.

5. The high aperture ratio display of claim 4, wherein each tile further includes a first layer having the thin film transistors and a second layer located under the first layer and containing the drive circuits, and wherein both the first and second layer are contained in an area defined by the outermost pixels of the tile.

6. The high aperture ratio display of claim 4, wherein the drive circuits, the electrically connected circuits, and the conductors on each tile are each contained in an area defined by the outermost pixels of the tile.

7. The high aperture ratio display of claim 2, wherein at least one conductor connection to the electrical circuits extends past the outermost pixels and terminates along one or more of the edges of the tile.

8. The high aperture ratio display of claim 3, wherein at least one conductor line to the drive circuits extends past the pixel array and terminates along one or more of the edges of the tile.

9. The high aperture ratio display of claim 4, wherein at least one signal line to the drive circuits extends past the outermost pixels and terminates along one or more of the edges of the tile.

10. The high aperture ratio display of claim 1, further including a transparent cover plate, wherein the tiles are bonded to the transparent cover plate, and the high aperture ratio display is viewed through the cover plate.

11. The high aperture ratio display of claim 4, further including a transparent cover plate, wherein the tiles are bonded to the transparent cover plate, and the high aperture ratio display is viewed through the cover plate.

12. The high aperture ratio display of claim 10, further including a polarization layer over the viewing side of the cover plate.

13. The high aperture ratio display of claim 11, further including a polarization layer over the viewing side of the cover plate.

14. The high aperture ratio display of claim 10, wherein the pixels emit monochromatic light, and further including filters of different colors disposed on the cover plate and aligned to the pixels to provide full color capability, and wherein the filters are located on the side of the cover plate next to the pixels.

15. The high aperture ratio display of claim 11, wherein the pixels emit monochromatic light, and further including filters of different colors disposed on the cover plate and aligned to the pixels to provide full color capability, and wherein the filters are located on the side of the cover plate next to the pixels.

16. The high aperture ratio display of claim 1, wherein the pixels emit different color light and are arranged in a pattern to produce a full-color high aperture ratio display.

17. The high aperture ratio display of claim 4, wherein the pixels emit different color light and are arranged in a pattern to produce a full-color high aperture ratio display.

18. The high aperture ratio display of claim 10, further including a back plate, wherein the high aperture ratio display is mounted to the back plate.

19. The high aperture ratio display of claim 11, further including a back plate, wherein the high aperture ratio display is mounted to the back plate.

20. The high aperture ratio display of claim 1, further including at least one conductor provided along a tile edge to an adjacent tile, wherein the conductor terminates on an outer edge of the high aperture ratio display.

21. The high aperture ratio display of claim 4, further including at least one conductor provided along a tile edge to an adjacent tile, wherein the conductor terminates on an outer edge of the high aperture ratio display.

22. The high aperture ratio display of claim 1, wherein the pixel aperture ratio is at least 60%.

23. The high aperture ratio display of claim 4, wherein the pixel aperture ratio is at least 60%.

* * * * *

UNITED STATES PATENT AND TRADEMARK OFFICE
CERTIFICATE OF CORRECTION

PATENT NO. : 6,853,411 B2
DATED : February 8, 2005
INVENTOR(S) : Henry R. Freidhoff et al.

It is certified that error appears in the above-identified patent and that said Letters Patent is hereby corrected as shown below:

<u>Column 7,</u>
Line 34, "die, end" should read -- tile, and --

Signed and Sealed this

Twenty-fourth Day of May, 2005

JON W. DUDAS
*Director of the United States Patent and Trademark Office*